US007161244B2

(12) United States Patent
Fournier et al.

(10) Patent No.: US 7,161,244 B2
(45) Date of Patent: Jan. 9, 2007

(54) MICROWAVE DEVICE FOR DISSIPATING OR ATTENUATING POWER

(75) Inventors: André Fournier, La Verpilliere (FR); Laurent Boillot, Voiron (FR)

(73) Assignee: Radiall, Rosny sous Bois (FR)

( * ) Notice: Subject to any disclaimer, the term of this patent is extended or adjusted under 35 U.S.C. 154(b) by 15 days.

(21) Appl. No.: 10/803,165

(22) Filed: Mar. 16, 2004

(65) Prior Publication Data

US 2004/0227232 A1 Nov. 18, 2004

(30) Foreign Application Priority Data

Mar. 19, 2003 (FR) .................................. 03 03339

(51) Int. Cl.

*H01L 23/34* (2006.01)
*H01L 23/48* (2006.01)
*H01L 23/52* (2006.01)
*H01L 29/40* (2006.01)

(52) U.S. Cl. ....................... 257/728; 257/664; 257/691

(58) Field of Classification Search .............. 333/81 A, 333/81 B, 81 R, 172; 257/781, 750, 728, 257/664, 691

See application file for complete search history.

(56) References Cited

U.S. PATENT DOCUMENTS 4,267,531 A 5/1981 Spinner et al.
4,670,723 A * 6/1987 Roland et al. ............ 333/81 A
4,711,835 A * 12/1987 Dufour ....................... 430/314
4,965,538 A 10/1990 Mickey, III
5,822,196 A * 10/1998 Hastings et al. ............ 361/801
6,875,671 B1 * 4/2005 Faris .......................... 438/455

OTHER PUBLICATIONS

Patent Abstracts of Japan, vol. 1997, No. 02, Feb. 28, 1997 & JP 08 279704 A (Advantest Corp), Oct. 22, 1996.
Patent Abstracts of Japan, vol. 016, No. 385 (E-1249), Aug. 17, 1992 & JP 04 125903 A (Hirose Electric Co Ltd), Apr. 27, 1992.

* cited by examiner

*Primary Examiner*—Nitin Parekh
(74) *Attorney, Agent, or Firm*—Schweitzer Cornman Gross & Bondell LLP

(57) ABSTRACT

The present invention relates to a microwave device for at least one of dissipating and attenuating power, the device comprising:

an insulating substrate;

at least one conductive strip of a microwave transmission line on a face of the substrate;

at least one ground zone; and at least one resistive layer placed on said face of the substrate, the resistive layer having at least a first region to which the conductive strip(s) is connected and a second region connected to the ground zone, the resistive layer presenting a longitudinal axis;

in which device:

the resistive layer is covered at least in part by a ground plane connected to the ground zone and insulated from the resistive layer by an insulating layer;

wherein said ground plane comprises a conductive material silkscreen printed on the insulating layer.

14 Claims, 3 Drawing Sheets

MICROWAVE DEVICE FOR DISSIPATING OR ATTENUATING POWER

The present invention relates to a microwave device for dissipating or attenuating power.

The present invention relates specifically to a device forming a medium to high power resistive load, i.e. having a power rating of the order of a few watts (W) to 200 W, in particular for use in cellular radio base stations or in wireless local area networks of the WLAN type.

BACKGROUND OF THE INVENTION

Such a device, used in a microwave system, serves in particular in the event of malfunction to dissipate the non-active energy of the system in the form of heat, and in particular the energy carried in a microwave transmission line.

Such a microwave transmission line can be constituted by a dielectric substrate having one face carrying a conductive strip and its opposite face carrying a metal ground area, the conductive strip being connected to a resistive layer deposited on the substrate.

Such a transmission line is generally referred to as a "microstrip".

The impedance of such a microwave transmission line is generally 50 ohms (Ω).

The device forming a resistive load can be housed in a package connected to the system by a cable, thus enabling the device to be put into contact with a cooling radiator. Such a device is commonly referred to as an offset load.

In a variant, the device may be fixed directly onto a piece of equipment of the system, e.g. a circuit thereof.

Patent No. EP 0 092 137 describes a device forming a resistive load that comprises an insulating substrate having deposited thereon adjacent resistive layers in the form of circular sectors. The outer arc of a resistive layer constitutes the input of the device and the inner arc its output. That device seeks to enable heat power to be dissipated more uniformly and to a greater extent.

French patent application No. FR 2 486 720 describes a device for terminating a microwave transmission line, the device comprising a dielectric substrate with a resistive layer constituting a terminating load on one face. The resistive layer may present a trapezoidal shape with its major base constituting the input for the microwave transmission line and with its minor base being connected to ground metallization. A transverse conducive strip may be deposited on the resistive layer in contact with the conductive strip and interconnecting two metallizations that are to co-operate with a ground plane to form two capacitors.

U.S. Pat. No. 6,326,862 describes an electrical termination system comprising a package having a dielectric substrate supporting a termination circuit element located therein. The package has a first cavity that is relatively tall, above the junction between the inner conductor of the coaxial cable and the dielectric substrate. This first cavity opens out into a second cavity of smaller height. The double cavity is intended to correct impedance mismatches.

OBJECTS AND SUMMARY OF THE INVENTION

The present invention seeks in particular to propose a novel microwave device, in particular a "microstrip" type device forming a resistive load making it possible to reduce impedance mismatches significantly, and to do so over a broad range of frequencies.

Thus, the invention provides a microwave device, in particular a device forming a resistive load or an attenuator, for dissipating or attenuating power, the device comprising:

- an insulating substrate;
- at least one conductive strip of a microwave transmission line on a face of the substrate;
- at least one ground zone; and
- at least one resistive layer placed on the above-mentioned face of the substrate, the resistive layer having at least a first region to which the conductive strip(s) is connected and a second region connected to the ground zone, the resistive layer presenting a longitudinal axis;

wherein:

- the first region presents a dimension extending transversely to the longitudinal axis of the resistive layer that is less than that of the second region; and/or
- the resistive layer is covered at least in part by a ground plane connected to the above-mentioned ground zone and insulated from the resistive layer by an insulating layer.

In the invention, because the first region is narrower than the second region, the capacitive mismatch at the input to the resistive layer is reduced.

Preferably, the or each first region of the resistive layer is of a shape that converges towards the conductive strip, this first region possibly being substantially trapezoidal in shape, for example, the conductive strip(s) being connected to the resistive layer via the minor base of the trapezium.

To make a resistive load, the entire resistive layer may be substantially trapezoidal in shape, in which case the ground zone is connected to said layer via the major base of the trapezoid.

In a variant, the second region is substantially rectangular and the ground zone is connected to said region by one side of the rectangle.

To make an attenuator having two conductive strips, the resistive layer has two first regions each connected to a conductive strip and to a central rectangular second region connected to the ground zone.

In a variant or in combination with the above-specified shapes for the resistive layer, the invention makes it possible to reduce impedance mismatches by covering the resistive layer at least in part with a ground plane connected to the ground zone and insulated from the resistive layer by an insulating layer.

In the invention, by combining the above-specified shapes for the resistive layer with the presence of the ground plane above the resistive layer, it is possible to obtain a reduction in capacitive and inductive mismatches, and thus to obtain better microwave matching, for frequencies up to about 8 gigahertz (GHz).

In addition, the device of the invention can be of relatively low cost price.

Preferably, the ground plane does not cover the input region entirely, being set back from the junction between the conductive strip(s) and the resistive layer(s).

The ground plane may cover the second region of the resistive layer(s) completely.

Advantageously, the ground plane extends transversely over the entire width of the resistive layer(s).

When the ground plane is made directly on the substrate, being adjacent to the second region, the above-specified ground plane advantageously comes into electrical contact with said ground zone, behind the resistive layer.

In an embodiment of the invention, the substrate carries two lateral conductive tracks on either side of the resistive layer and connected to said ground zone, the ground plane covering said tracks.

Advantageously, the above-specified ground plane is connected to lateral ground zones extending over the edge faces of the substrate, in particular those which are parallel to the axis of the resistive layer.

These lateral ground zones may be constituted by metallization made on the edge faces.

The insulating layer may be a layer of glass, e.g. deposited by silkscreen printing on the resistive layer.

The ground plane may comprise a conductive material deposited on the insulating layer, in particular by silkscreen printing.

The ground zone on the substrate may be connected to a ground plane on the other face of the substrate, in particular by one or more metallizations on an edge face of the substrate, or in a variant via metal-plated through holes made in the thickness of the substrate.

In a variant, the device includes an insert with a conductive wall that is pressed against the insulating layer and defines the ground plane.

In an embodiment of the invention, the insert has at least one lateral conductor arm connected to the ground plane and suitable for pressing against an edge face of the substrate and optionally, where appropriate, against one of the above-mentioned lateral conductive tracks.

When the device is an offset load, the insert may include at least one conductive and elastically deformable tab suitable for pressing against a wall of the package, thus providing an electrical connection between the ground plane of the device and the wall of the package.

The insert may also be arranged to hold the substrate on the bottom of the package. In other words, there is no need to make a metallurgical bond, e.g. by soldering, between the substrate and the bottom of the package, with retention in the package being obtained mechanically. The substrate then need not have any metallization on its face opposite from its face carrying the resistive layer, the ground plane being connected to the ground of the package.

In particular when the device is fixed directly on a piece of equipment of the system, the insert may include, for example, at least one fastener portion enabling it to be fastened on a support, in particular by soldering.

The invention also provides a microwave device for at least one of dissipating and attenuating power comprising:

- an insulating substrate;
- at least one conductive strip of a microwave transmission line on one face of the substrate;
- at least one ground zone; and
- at least one resistive layer deposited on the above-specified face of the substrate, the resistive layer including at least a first region to which the conductive strip(s) is connected, and a second region connected to the ground zone, the resistive layer presenting a longitudinal axis, in which device:

- the resistive layer is covered at least in part by a ground plane connected to the ground zone and insulated from the resistive layer by an insulating layer; wherein the device includes an insert comprising a conductive wall pressed against the insulating layer and defining the ground plane, and wherein the insert is arranged to hold the substrate on the bottom of a package in which the device is housed. The invention also provides a microwave device for attenuating power and forming an attenuator, the device comprising:
- an insulating substrate;
- at least one conductive strip of a microwave transmission line on a face of the substrate;
- at least one ground zone; and
- at least one resistive layer placed on the above-mentioned face of the substrate, the resistive layer having at least a first region to which the conductive strip(s) is connected and a second region connected to the ground zone, the resistive layer presenting a longitudinal axis;

wherein:

- the first region presents a dimension extending transversely to the longitudinal axis of the resistive layer that is less than that of the second region.

The invention also provides a microwave device for attenuating power and forming an attenuator, the device comprising:

- an insulating substrate;
- at least one conductive strip of a microwave transmission line on a face of the substrate;
- at least one ground zone; and
- at least one resistive layer placed on the above-mentioned face of the substrate, the resistive layer having at least a first region to which the conductive strip(s) is connected and a second region connected to the ground zone, the resistive layer presenting a longitudinal axis;

wherein:

- the resistive layer is covered at least in part by a ground plane connected to the ground zone and insulated from the resistive layer by an insulating layer. The invention also provides a method for manufacturing a microwave device for at least one of dissipating and attenuating power, the device comprising:
- an insulating substrate;
- at least one conductive strip of a microwave transmission line on a face of the substrate;
- at least one ground zone; and
- at least one resistive layer placed on said face of the substrate, the resistive layer having at least a first region to which the conductive strip(s) is connected and a second region connected to the ground zone, the resistive layer presenting a longitudinal axis; in which device:
- the resistive layer is covered at least in part by a ground plane connected to the ground zone and insulated from the resistive layer by an insulating layer;
- wherein the method comprises following step:
- making the ground plane by dispositing by screen-printing a conductive material on the insulating layer.

BRIEF DESCRIPTION OF THE DRAWINGS

The invention can be better understood on reading the following detailed description of non-limiting embodiments, and on examining the accompanying drawings, in which.

MORE DETAILED DESCRIPTION

Figure 1:
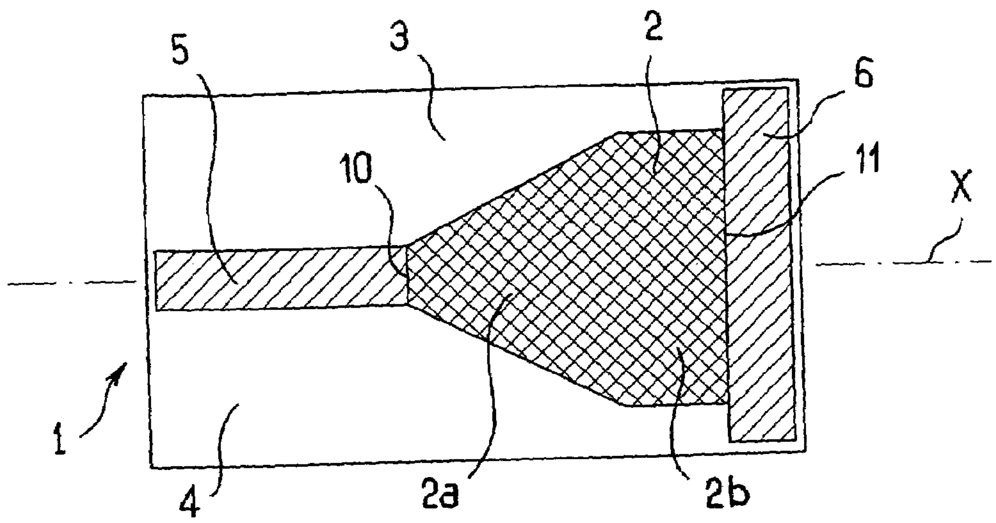
FIG. 1 is a diagrammatic and fragmentary plan view of a device forming a resistive load in accordance with the invention.

FIG. 1 shows a device 1 forming a microwave resistive load for dissipating power, the device comprising a resistive layer 2 deposited on a face 4 of an insulating substrate 3, the resistive layer 2 being connected firstly to a conductive strip 5 and secondly to a ground zone 6 also deposited on the face 4 of the insulating substrate 3.

The device 1 is for use in a microwave system.

The substrate 3 may be made of ceramic, in particular of alumina or of aluminum nitride (AlN).

Together with the conductive strip 5 and a ground area 8 situated on a face 7 opposite the face 4 the substrate 3 forms a microwave transmission line.

The ground area 8 may be soldered to a support (not shown).

The ground zone 6 may be connected to the ground area 8 by one or more areas of metallization formed on an edge face 3*a* of the substrate 3 or on metal-plated through holes made through the thickness of the substrate 3.

The resistive layer 2 may be deposited on the substrate 3 by silkscreen printing or in a thin layer, for example.

In the example described, the resistive layer 2 has an input region 2*a* that is substantially in the form of an isosceles trapezoid, the conductive strip 5 being connected to said region 2*a* via the minor base 10 of the trapezoidal.

At its end opposite from the minor base 10, the region 2*a* is extended by a rectangular region 2*b* whose long side coincides with the major base of the trapezoid.

The ground zone 6 is connected to the resistive layer 2 along a long side 11 of the rectangle.

The resistive layer 2 presents a longitudinal axis X which is parallel to the conductive strip 5 in the example described.

This particular shape for the resistive layer 2 serves in particular to reduce capacitive mismatch at the input of the resistive layer.

Figure 2:
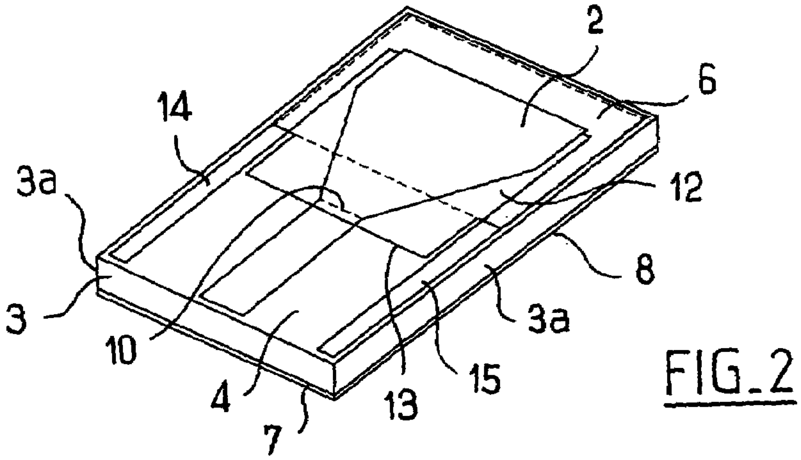
FIGS. 2 and 3 are diagrammatic and fragmentary views respectively in perspective and as seen from above of a variant embodiment of the device of the invention forming a resistive load.
Figure 3:
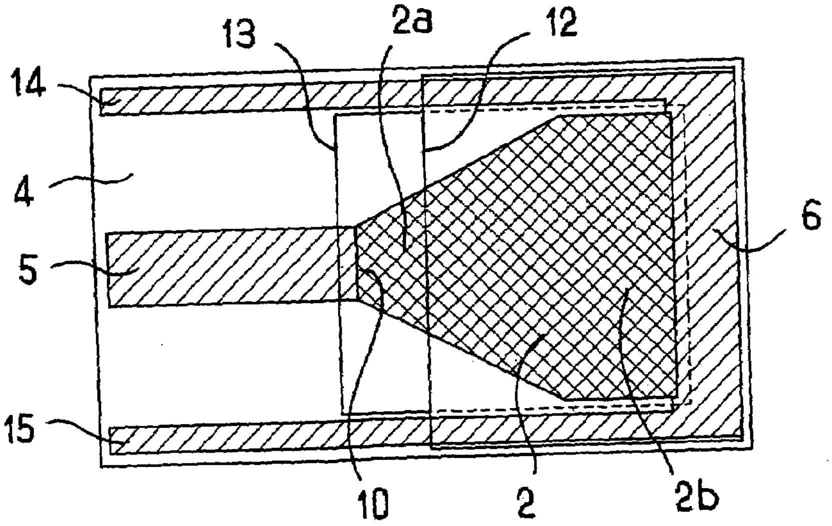

To further improve microwave matching of the device 1, it is possible, as shown in FIGS. 2 and 3, to extend the ground zone 6 by a ground plane 12 partially covering the resistive layer 2.

For this purpose, the resistive layer 2 is completely covered in an insulating layer 13 which is constituted, for example, by a layer of glass deposited by silkscreen printing.

The ground plane 12 is rectangular in shape and of length substantially equal to the width of the substrate.

The ground plane 12 covers the ground zone 6 and is set back from the minor base 10 of the trapezoid.

In other words, the ground plane 12 covers the region 2*b* of the resistive layer 2 completely while leaving uncovered the junction portion between the conductive strip 5 and the resistive layer 2.

In the example described, the ground plane 12 is made from a conductive paste deposited on the insulating layer 13.

As can be seen in FIGS. 2 and 3, the ground zone 6 may be connected to two lateral conductive tracks 14, 15 parallel to the axis X.

The ground plane 12 covers the tracks 14, 15, and makes contact with them.

The presence of these tracks 14, 15 connected to the ground plane 12 serves to further improve microwave matching.

The edge faces 3*a* of the substrate 3 parallel to the axis X can be metallized and connected electrically to the ground plane 12.

Figure 4:
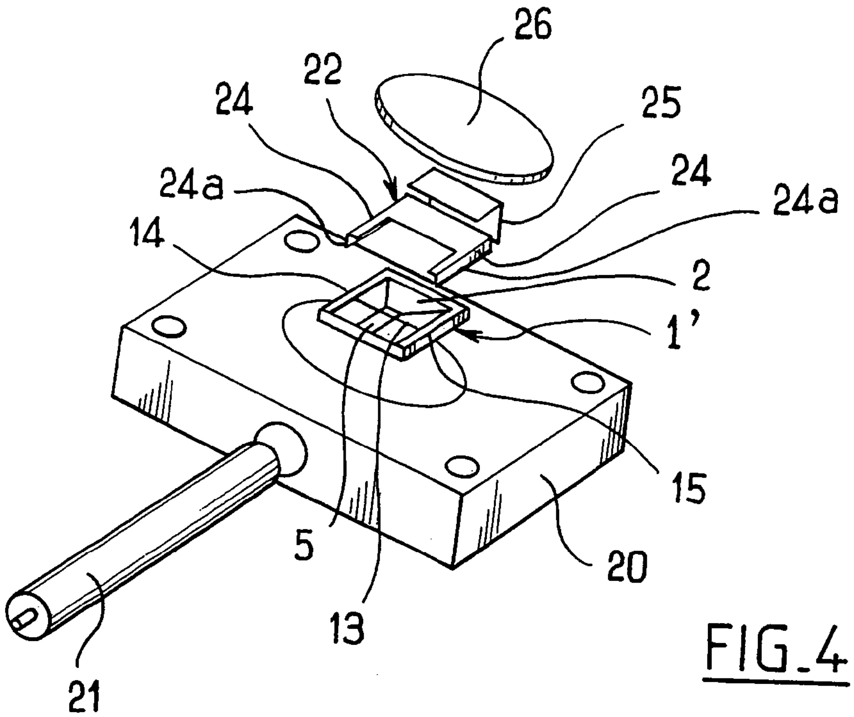
FIG. 4 is a diagrammatic and fragmentary exploded view of a device forming a resistive load in accordance with the invention, and housed in a package.
Figure 5:
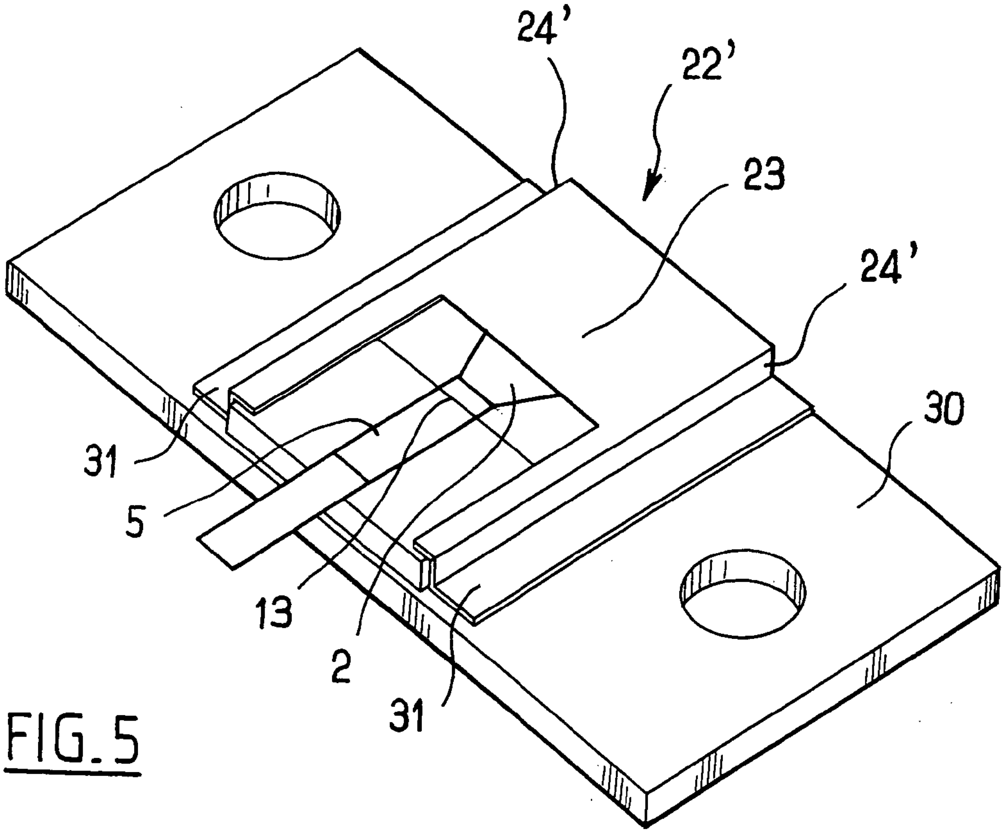
FIG. 5 is a diagrammatic and fragmentary perspective view of a device forming a resistive load in accordance with a variant embodiment of the invention.

FIG. 4 shows a device 1' forming a resistive load that is offset and that constitutes a variant embodiment of the invention.

The device 1' is housed in a package 20 which can be at a distance from the microwave system, in particular in order to enable it to be put into contact with a cooling radiator.

The device 1' differs from the device 1 described above by the fact that the ground plane is not constituted by a layer of conductive material deposited on the substrate, but is defined by a central wall 23 of a metal insert 22 which is pressed against the substrate 3.

The conductive strip 5 is for connection to the central conductor of a coaxial cable 21 having one end connected to the package 20.

On either side of the central wall 23, the insert 22 comprises two lateral arms 24 for pressing against two parallel edges of the substrate 3 and against the conductive tracks 14 and 15. Each of the arms 24 has a vertical portion 24*a* that presses against an edge face of the substrate 3.

On its top face, the insert 22 has a conductive and elastically deformable tab 25 suitable for pressing against a conductive lid 26 for the package 20. In the invention, it is possible to provide a plurality of conductive tabs 25.

In the example described, the resistive layer 2 is obtained by depositing a conductive paste on the substrate 3.

In the example described, the insert 22 enables the substrate 3 to be held on the bottom of the package 20, with this retention being of a mechanical kind.

The tab(s) 25 also serve(s) to provide electrical contact between the ground zone 6 and the package 20.

When the device forming a resistive load is fixed directly on a piece of equipment of the system, without being housed in a special package, the insert 22' need not have an elastically deformable tab 25 and its lateral arms 24' may carry extensions 31 suitable for soldering the insert 22 onto a support 30.

The support 30 may be constituted by a metal plate or circuit fixed to the equipment of the system, for example.

Naturally, the invention is not limited to the embodiments described above.

It is also possible to provide an insulating layer directly on the face of the insert that faces the resistive layer 2, thereby replacing the insulating layer 13 deposited on the substrate.

Figure 6:
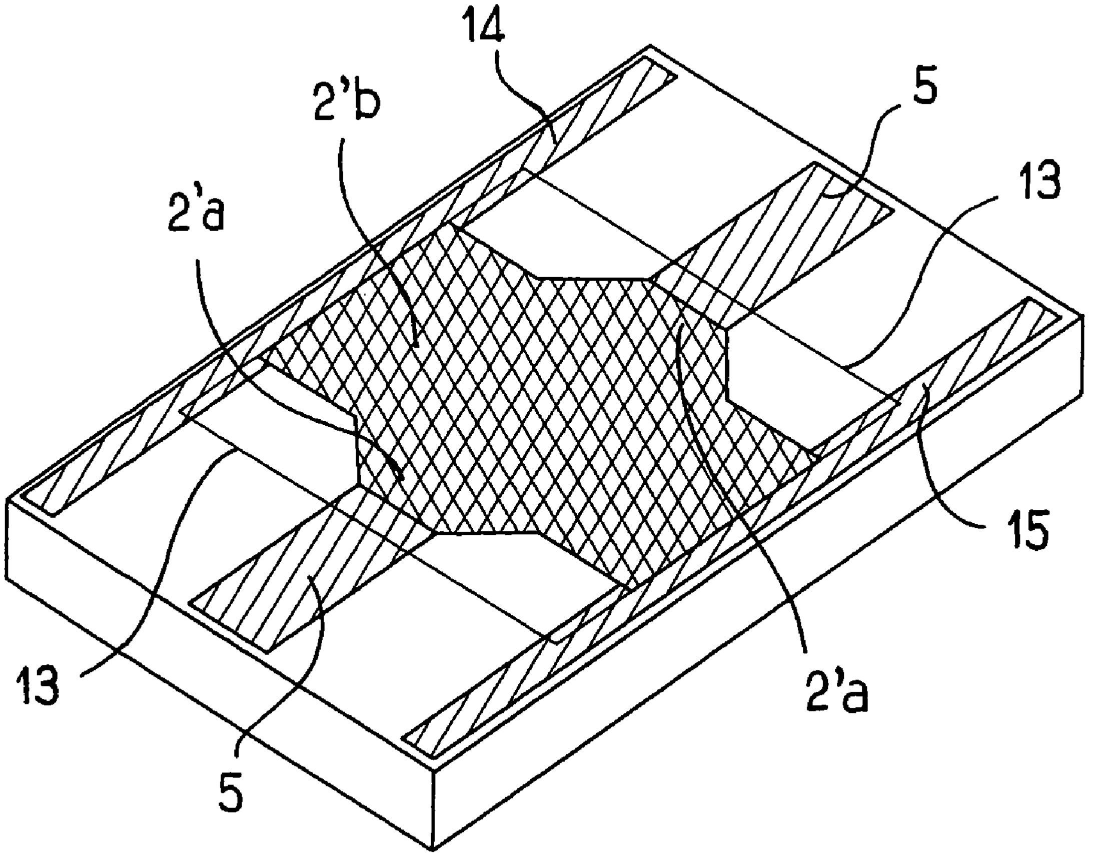
FIG. 6 is a diagrammatic and fragmentary perspective view of an embodiment of an attenuator of the invention.

The microwave device of the invention may also be arranged as an attenuator. An embodiment of an attenuator-forming device is shown in FIG. 6.

The resistive layer 2' is symmetrical in configuration, comprising two trapezoidal regions 2'*a* having their major bases connected to the long sides of a central rectangular region 2'*b* whose short sides are connected to ground. The trapezoidal zones 2'*b* are connected via their minor bases to conductive strips 5.

As in the preceding embodiments, a ground plane is provided (not shown) that does not completely cover the resistive layer 2'.

What is claimed is:

1. A microwave device for at least one of dissipating and attenuating power, the device comprising:

an insulating substrate;

at least one conductive strip of a microwave transmission line on a face of the substrate;

at least one ground zone; and at least one resistive layer placed on said face of the substrate having at least a first region to which the at least one conductive strip is connected and a second region connected to the ground zone, the at least one resistive layer presenting a longitudinal axis;

the at least one resistive layer being covered at least in part by a ground plane connected to the ground zone and insulated from the at least one resistive layer by an insulating layer;

wherein said ground plane comprises a conductive material silkscreen printed on the insulating layer.

2. A device according to claim 1, wherein the first region of the at least one resistive layer presents a shape that converges towards the at least one conductive strip.

3. A device according to claim 2, wherein the first region presents a substantially trapezoidal shape, the at least one conductive strip being connected to the resistive layer via a minor base of the trapezoid.

4. A device according to claim 3, wherein the entire resistive layer is substantially trapezoidal in shape, the ground zone being connected to said resistive layer via a major base of the trapezoid.

5. A device according to claim 1, wherein the second region is substantially rectangular, and the ground zone connects to said second region via one side of the rectangle.

6. A device according to claim 1, wherein the ground plane does not completely cover the first region, being set back from the junction between the conductive strip and the resistive layer.

7. A device according to claim 1, wherein the ground plane covers the second region completely.

8. A device according to claim 1, wherein the ground plane extends transversely over the entire width of the resistive layer.

9. A device according to claim 1, in which the ground zone is formed on the substrate, being adjacent to the second region, wherein the ground plane comes into electrical contact with said ground zone behind the resistive layer.

10. A device according to claim 1, wherein the substrate carries two lateral conductive tracks on either side of the resistive layer connected to said ground zone, the ground plane covering said tracks.

11. A device according to claim 1, wherein the ground plane is connected to lateral ground zones extending along edge faces of the substrate.

12. A device according to claim 1, wherein the first region presents a dimension extending transversely to the longitudinal axis of the resistive layer, that is less than that of the second region.

13. A device according to claim 1, wherein the device forms at least one of a resistive load and an attenuator.

14. A microwave device for at least one of dissipating and attenuating power, the device comprising:

an insulating substrate;

at least one conductive strip of a microwave transmission line on a face of the substrate;

at least one ground zone; and at least one resistive layer placed on said face of the substrate, the at least one resistive layer having at least a first region to which the at least one conductive strip is connected and a second region connected to the ground zone, the resistive layer presenting a longitudinal axis;

the at least one resistive layer being covered at least in part by a ground plane connected to the ground zone and insulated from the at least one resistive layer by an insulating layer;

wherein the substrate carries two lateral conductive tracks on either side of the at least one resistive layer and connected to said ground zone, the ground plane covering at least partially said tracks.

* * * * *